(12) United States Patent
Washiya et al.

(10) Patent No.: US 8,186,992 B2
(45) Date of Patent: May 29, 2012

(54) MICROPATTERN TRANSFER DEVICE

(75) Inventors: Ryuta Washiya, Hitachi (JP); Masahiko Ogino, Hitachi (JP); Noritake Shizawa, Ninomiya (JP); Kyoichi Mori, Osio (JP); Akihiro Miyauchi, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/692,135

(22) Filed: Jan. 22, 2010

(65) Prior Publication Data

US 2010/0189836 A1    Jul. 29, 2010

(30) Foreign Application Priority Data

Jan. 22, 2009 (JP) .................. 2009-011474

(51) Int. Cl.
*B29C 59/00* (2006.01)
(52) U.S. Cl. ..................... 425/385; 264/293
(58) Field of Classification Search .............. 425/385; 264/293
See application file for complete search history.

(56) References Cited

U.S. PATENT DOCUMENTS

| | | | |
|---|---|---|---|
| 2004/0149367 A1* | 8/2004 | Olsson et al. | 156/64 |
| 2005/0184436 A1* | 8/2005 | Jeong et al. | 264/496 |
| 2006/0131785 A1* | 6/2006 | Sewell | 264/299 |
| 2009/0061035 A1* | 3/2009 | Cho et al. | 425/174.4 |

FOREIGN PATENT DOCUMENTS

| | | |
|---|---|---|
| JP | 2002-197731 | 7/2002 |
| JP | 2004-335012 | 11/2004 |
| JP | 2005-038596 | 2/2005 |
| JP | 2005-166241 | 6/2005 |

* cited by examiner

*Primary Examiner* — Maria Veronica Ewald
(74) *Attorney, Agent, or Firm* — Antonelli, Terry, Stout & Kraus, LLP.

(57) ABSTRACT

In a micropattern transfer device, a stamper on which a fine indented pattern is formed is brought into contact with a material to be transferred, and the fine indented pattern on the stamper is transferred onto a surface of the material to be transferred. The micropattern transfer device includes a holding mechanism which holds an entire outer circumferential portion of the material to be transferred. The holding mechanism holds the material to be transferred such that a distance between the material to be transferred and the stamper is substantially equal to or shorter than a distance between the holding mechanism and the stamper.

2 Claims, 11 Drawing Sheets

MICROPATTERN TRANSFER DEVICE

CROSS REFERENCE TO RELATED APPLICATIONS

This application claims the benefit of Japanese Patent Application No. 2009-011474 filed on Jan. 22, 2009, the disclosure of which is incorporated herein by reference.

BACKGROUND OF THE INVENTION

1. Field of the Invention

The present invention relates to a micropattern transfer device for transferring a fine indented pattern formed on a surface of a stamper, onto a surface of a material to be transferred.

2. Description of the Related Art

Semiconductor integrated circuits have been made extremely smaller in recent years. When patterns of such extremely small circuits are formed, a high degree of accuracy is required in, for example, photolithography. However, micro-fabrication of those circuits with a high accuracy is now approaching its limit, because a scale of the micro-fabrication has nearly reached a wavelength of an exposing source itself for use in the micro-fabrication. To obtain an even higher accuracy, an electron beam writing technique, which is a technique relevant to a charged particle beam apparatus, has also been used instead of photolithography.

However, in forming patterns of extremely small circuits with an electron beam writing technique, the more patterns are drawn with the electron beam writing apparatus, the more time it takes for exposure. This is because the electron beam writing technique does not use a one-shot exposure with an exposing source such as an i-ray and an excimer laser. Hence, the more integrated the circuits become, the more time it takes for forming patterns, which results in a poor throughput.

To speed up the formation of patterns using an electron beam writing apparatus, a technique of electron beam cell projection lithography has been developed, in which electron beams are irradiated en bloc on a plurality of combined masks having various shapes. Such an electron beam writing apparatus for use in the electron beam cell projection lithography is necessarily large-sized and high-priced, because a structure of the apparatus becomes more complex, and a mechanism for controlling each position of the masks with a higher accuracy is required.

In forming patterns of extremely small circuits, imprint lithography has also been known, in which a stamper having a fine pattern complementary to a desired one is stamped onto a surface of a material to be transferred. The material to be transferred is, for example, a substrate having a resin layer thereon. The imprint lithography can transfer a microstructure having an indented width on a 25 nm scale or less onto the above-described resin layer on the substrate as a material to be transferred. More specifically, the resin layer (which may also be referred to as a "pattern forming layer") includes a thin film layer formed on the substrate and a patterned layer composed of protrusions formed on the thin film layer. The imprint lithography has also been applied to creation of a pattern of recording bits for a large capacity recording medium and of a pattern of a semiconductor integrated circuit. For example, a mask for fabricating a large capacity recording medium substrate or a semiconductor integrated circuit substrate can be prepared by: using protrusions of a pattern forming layer using the imprint lithography as a mask; and etching portions of a thin film layer that expose as recesses of the pattern forming layer, and portions of a substrate that are immediately under the portions of the thin film layer.

In the imprint lithography, after the stamper is pressed against the resin layer formed on a surface of the material to be transferred, the stamper is separated therefrom, thus allowing a fine pattern on the stamper to be transferred onto the resin layer of the material to be transferred. At this time, a pressure and separation mechanism is required which allows repeated transfers using one and the same stamper without damaging a surface of the stamper or an edge of the material to be transferred such as a disk.

Japanese Laid-Open Patent Application, Publication No. 2004-335012 discloses a separating technique in which a portion of a stamper is suctioned and is pulled up from a material to be transferred. Japanese Laid-Open Patent Application, Publication No. 2002-197731 and Japanese Laid-Open Patent Application, Publication No. 2005-166241 disclose another separating technique in which a wedge is inserted between a stamper and a material to be transferred to make a gap, into which compressed air is fed, to thereby separate the stamper and the material to be transferred.

In those conventional techniques, a portion of a stamper or a material to be transferred may sometimes be locally loaded and may be thereby distorted or destructed. Thus, the conventional techniques are not suitable for a commercial mass production of a product, such as a large capacity recording medium substrate, in which repeated transfers are required using a single stamper.

The present invention has been made in an attempt to provide a micropattern transfer device capable of conducting repeated transfers using a single stamper without damaging the stamper or the material to be transferred.

SUMMARY OF THE INVENTION

A micropattern transfer device includes: a stamper on which a fine indented pattern is formed; a material to be transferred onto which the fine indented pattern on the stamper is transferred; and a holding mechanism which holds an entire outer circumferential portion of the material to be transferred. The stamper on which the fine indented pattern is formed is brought into contact with the material to be transferred, and the fine indented pattern on the stamper is transferred onto a surface of the material to be transferred. The holding mechanism holds the material to be transferred such that a distance between the material to be transferred and the stamper is substantially equal to or shorter than a distance between the holding mechanism and the stamper.

Other features and advantages of the present invention will become more apparent from the following detailed descriptions of the invention, when taken in conjunction with the accompanying exemplary drawings.

DETAILED DESCRIPTION OF THE EXEMPLARY EMBODIMENTS

First Embodiment

Figure 1A:
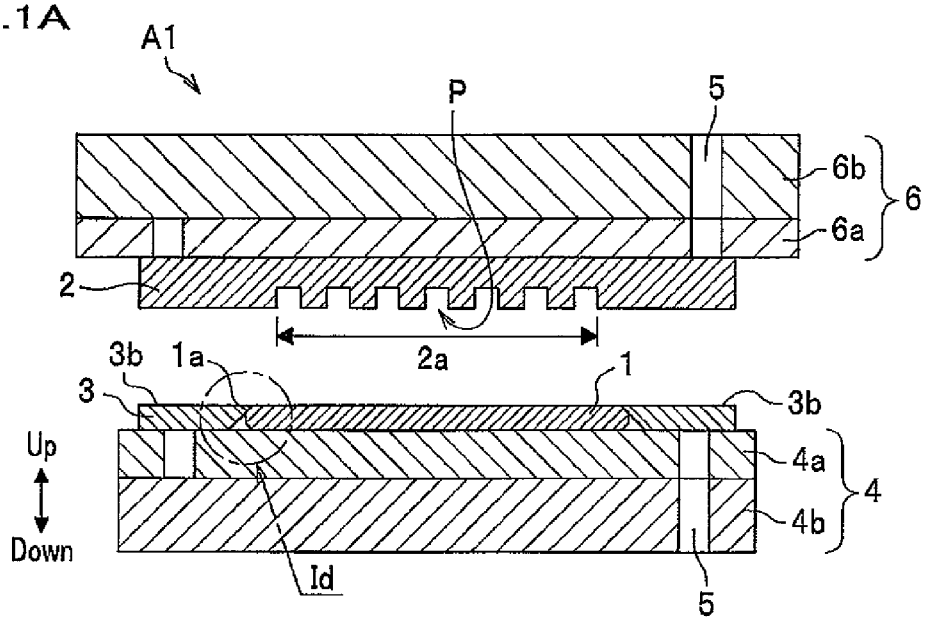
FIG. 1A is a view illustrating a configuration of a micropattern transfer device according to a first embodiment.
Figure 1B:
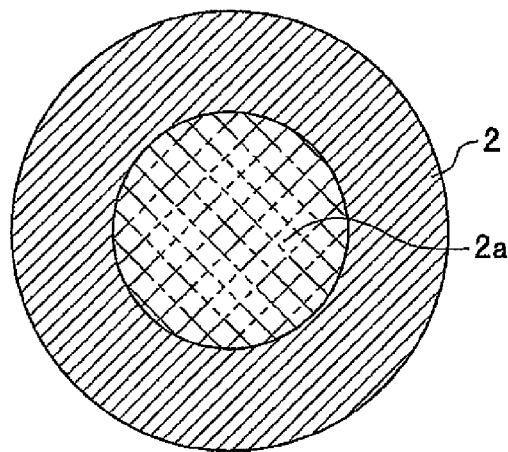
FIG. 1B is a schematic view illustrating a stamper, viewed from the below, of the micropattern transfer device according to the first embodiment.
Figure 1C:
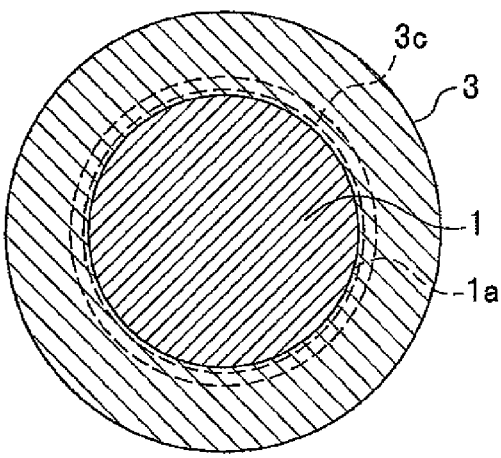
FIG. 1C is a schematic view illustrating a positional relationship between a holding mechanism and a material to be transferred, viewed from the above, of the micropattern transfer device according to the first embodiment.
Figure 1D:
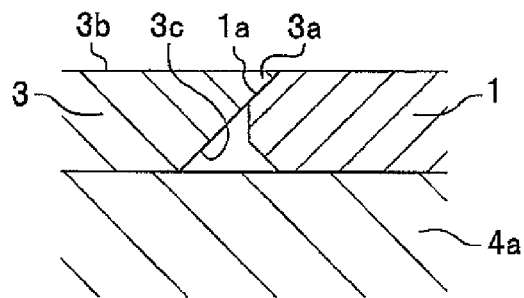
FIG. 1D is a partially enlarged view of a portion "1d" of FIG. 1A.
Figure 2A:
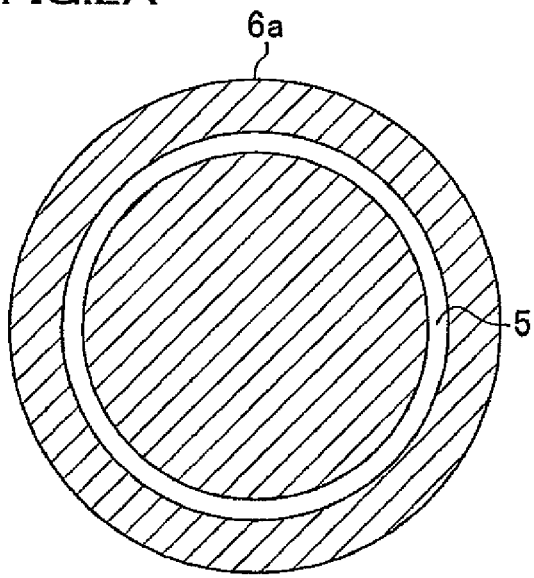
FIG. 2A is a plan view illustrating a lower transparent plate included in a plate of the micropattern transfer device according to the first embodiment.
Figure 2B:
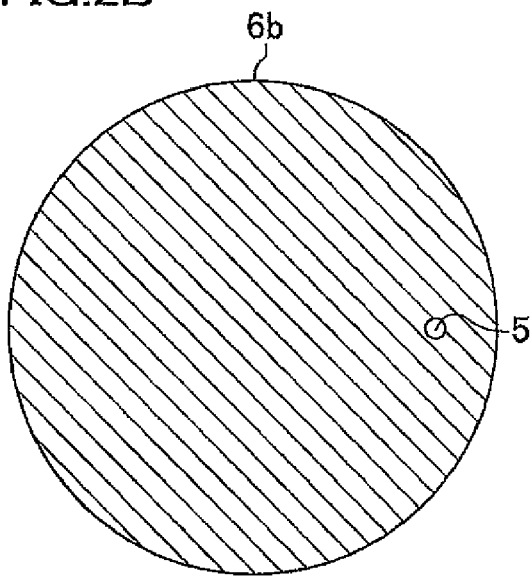
FIG. 2B is a plan view illustrating an upper transparent plate included in the plate of the micropattern transfer device according to the first embodiment.
Figure 2C:
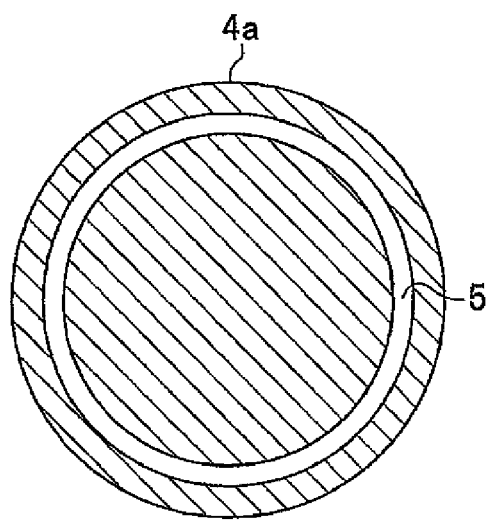
FIG. 2C is a plan view illustrating an upper stage of the micropattern transfer device according to the first embodiment.
Figure 2D:
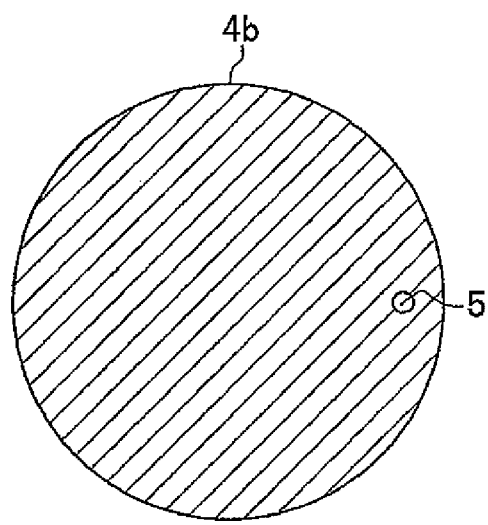
FIG. 2D is a plan view illustrating a lower stage of the micropattern transfer device according to the first embodiment.

Next is described in detail a first embodiment of the present invention with reference to related drawings. FIG. 1A is a view illustrating a configuration of a micropattern transfer device according to the first embodiment. FIG. 1B is a schematic view illustrating a stamper, viewed from the below, of the micropattern transfer device according to the first embodiment. FIG. 1C is a schematic view illustrating a positional relationship between a holding mechanism and a material to be transferred, viewed from the above, of the micropattern transfer device according to the first embodiment. FIG. 1D is a partially enlarged view of a portion "Id" of FIG. 1A. FIG. 2A is a plan view of a lower transparent plate included in a plate of the micropattern transfer device according to the first embodiment. FIG. 2B is a plan view of an upper transparent plate included in the plate of the micropattern transfer device according to the first embodiment. FIG. 2C is a plan view of an upper stage of the micropattern transfer device according to the first embodiment. FIG. 2D is a plan view of a lower stage of the micropattern transfer device according to the first embodiment. Note that an up and a down directions shown in FIG. 1A are applied to all descriptions below.

As shown in FIG. 1A, a micropattern transfer device A1 has a configuration in which a stamper 2 is brought into contact with a material to be transferred 1, to thereby transfer a fine indented pattern P on the stamper 2, onto a surface of the material to be transferred 1. The indented pattern P in this embodiment is formed at a nanometer scale. For simplification, a reference number P of the indented pattern is omitted hereinafter. Additionally, even after the indented pattern is transferred onto the material to be transferred, the material to be transferred is still referred to as the "material to be transferred".

The stamper 2 is disposed above the material to be transferred 1 as shown in FIG. 1A. The stamper 2 has a pattern forming area 2a on a surface facing the material to be transferred 1, as shown in FIG. 1B. A fine indented pattern is formed on the pattern forming area 2a.

Methods of forming a fine indented pattern include, for example, photolithography, focused ion beam lithography, electron beam writing, and nanoprinting technique. Any of the methods can be selected herein according to a processing accuracy required for an indented pattern to be formed.

The stamper 2 in this embodiment has a shape of a disk. However, the shape of the stamper 2 is not limited to this. The stamper 2 may have a round, oval or polygonal shape. The stamper 2 may have a hole at its center. The stamper 2 may have a shape or a surface area different from that of the material to be transferred 1 as long as the stamper 2 can transfer its fine indented pattern onto a prescribed area of the material to be transferred 1.

Release treatment based on fluorine, silicone, or the like may be applied to a surface of the stamper 2 so as to facilitate separation from a photo curable resin 7 to be described later (see FIG. 3D). A release layer such as a thin film made of metal compound may be formed on the surface of the stamper 2.

A plate 6 holds the stamper 2 as shown in FIG. 1A. The plate 6 includes a disk-shaped upper transparent plate 6b and a disk-shaped lower transparent plate 6a having a diameter substantially the same as that of the upper transparent plate 6b.

A vacuum suction port 5 in the plate 6 is ring-shaped at the lower transparent plate 6a as shown in FIG. 2A. The vacuum suction port 5 is a through hole at the upper transparent plate 6b penetrating therethrough, as shown in FIG. 2B. If the upper transparent plate 6b is suitably placed over the lower transparent plate 6a as shown in FIG. 1A, the vacuum suction port 5 communicates between the upper transparent plate 6b and the lower transparent plate 6a. An air exhaust means such as a vacuum pump, not shown, is connected to the vacuum suction port 5. This allows the stamper 2 to be vacuum suctioned and held by the plate 6 (the lower transparent plate 6a).

In a micropattern transfer method using the micropattern transfer device A1 of this embodiment, the stamper 2 and the plate 6 are each made of a transparent material such as quartz, glass and resin, which is to be described later in detail. This is because irradiation of electromagnetic waves such as ultraviolet is required to reach the photo curable resin dropped on the material to be transferred 1, transmitting through the stamper 2 and the plate 6 (see FIG. 3D).

The material to be transferred 1 is disposed below and faces the stamper 2, as shown in FIG. 1A. The material to be transferred 1 is made of, for example, silicone, various metals, glass, quartz, ceramic and resin. The material to be transferred 1 may be a multilayered structure having a surface composed of a metal layer, a resin layer, an oxide film layer, or the like.

The material to be transferred 1 in this embodiment has a shape of a disk. However, the shape of the material to be transferred 1 is not limited to this. The material to be transferred 1 may have a polygonal or an oval shape. The material to be transferred 1 may have a hole at its center.

The material to be transferred 1 has a surface with resin (for example, the photo curable resin 7 to be described later (see FIGS. 3A to 3E)), onto which a fine indented pattern on the stamper 2 is to be transferred.

An inclined part 1a is formed at an outer circumference of the material to be transferred 1, as shown in FIG. 1A. The inclined part 1a is inclined such that a portion of the inclined part 1a on a more outward side is farther from the stamper 2. The inclined part 1a is formed by chamfering an outer circumferential end of the material to be transferred 1. This forms the inclined part 1a on the entire outer circumference of the material to be transferred 1.

The holding mechanism 3 to be described next holds the material to be transferred 1 by hooking the inclined part 1a formed on the entire outer circumference.

The holding mechanism 3 is a ring-shaped member surrounding the outer circumference of the material to be transferred 1, as shown in FIG. 1C. The holding mechanism 3 has an inner circumferential surface 3c having an inclined angle same as that of the inclined part 1a of the material to be transferred 1 such that the inner circumferential surface 3c comes in contact with the inclined part 1a, as shown in FIG. 1D.

The inner circumferential surface 3c of the holding mechanism 3 comes in contact with the inclined part 1a of the material to be transferred 1 at all around the outer circumference thereof, as shown in FIG. 1C and FIG. 1D. A portion of the holding mechanism 3 which comes in contact with the outer circumference is referred to as a contact part 3a (see FIG. 1D). The contact part 3a may also be referred to as a holding part.

The ring-shaped holding mechanism 3 in this embodiment has a planar part 3b which is disposed outward and around the contact part 3a, as shown in FIG. 1D. The planar part 3b faces the stamper 2, as shown in FIG. 1A.

The holding mechanism 3 holds the material to be transferred 1 such that a distance between the holding mechanism 3 and the stamper 2 is substantially same as a distance between the material to be transferred 3 and the stamper 2, as shown in FIG. 1A.

The holding mechanism 3 may hold the material to be transferred 1 such that the distance between the holding mechanism 3 and the stamper 2 is longer than the distance between the material to be transferred 1 and the stamper 2, though not shown. In this case, a height of a step made by a difference between the two distances may be set within about 0.1 mm. However, the height of the step is not limited to this and may be determined according to a Young's modulus of a material of which the stamper 2 is made.

The holding mechanism 3 may be made of, for example, metal, resin, and elastic body (such as rubber).

In the micropattern transfer device A1, the holding mechanism 3 is held on a stage 4 as shown in FIG. 1A.

The stage 4 has thereon the material to be transferred 1 and vacuum-suctions the holding mechanism 3 for holding the material to be transferred 1. The stage 4 includes an upper stage 4a on which the material to be transferred 1 is put and a lower stage 4b disposed under the upper stage 4a.

Another vacuum suction pert 5 in the stage 4 is ring-shaped at the upper stage 4a as shown in FIG. 20. The vacuum suction port 5 is a through hole at the lower stage 4b penetrating therethrough, as shown in FIG. 20. If the upper stage 4b is suitably placed over the lower stage 4a as shown in FIG. 1A, the vacuum suction port 5 communicates therebetween. An air exhaust means such as a vacuum pump, not shown, is connected to the vacuum suction port 5. This allows the holding mechanism 3 to be vacuum suctioned to the stage 4 (the upper stage 4a), thus enabling the material to be transferred 1 to be vacuum suctioned to and held by the stage 4 (the upper stage 4a).

The stage 4 is designed to be kept in parallel to the plate 6. The stage 4 has an up-down mechanism (not shown) which can move the stage 4 up and down so as to parallelly apply pressure to and separate the material to be transferred 1 and the stamper 2.

In the micropattern transfer device A1 according to this embodiment, an outer circumferential portion of the stamper 2 is positioned more outward than the outer circumferential portion of the material to be transferred 1, as shown in FIG. 1A.

The outer circumferential portion of the holding mechanism 3 is positioned more outward than an outer circumferential portion of the pattern forming area 2a of the stamper 2.

Next is described a micropattern transfer method using the micropattern transfer device A1 of this embodiment. FIG. 3A to FIG. 3E to be referenced herein are views for explaining steps of the micropattern transfer method using the micropattern transfer device A1.

Figure 3A:
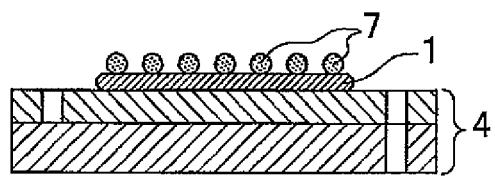
FIG. 3A to FIG. 3E are views for explaining steps of a micropattern transfer method using the micropattern transfer device according to the first embodiment.

As shown in FIG. 3A, in the micropattern transfer method, the material to be transferred 1 with the photo curable resin 7 having been applied thereto is disposed on the stage 4.

Figure 3B:
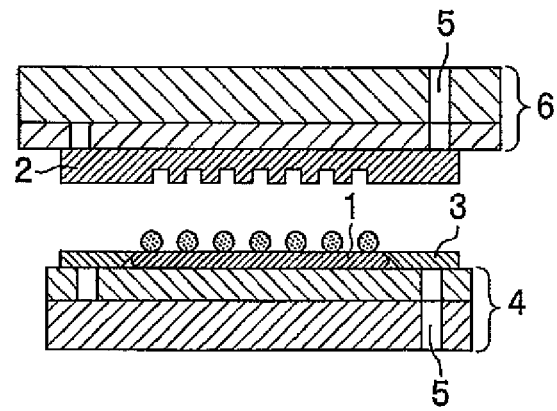

As shown in FIG. 3B, the holding mechanism 3 is arranged outside the material to be transferred 1 and is vacuum suctioned onto the stage 4 via the vacuum suction port 5.

Figure 3C:
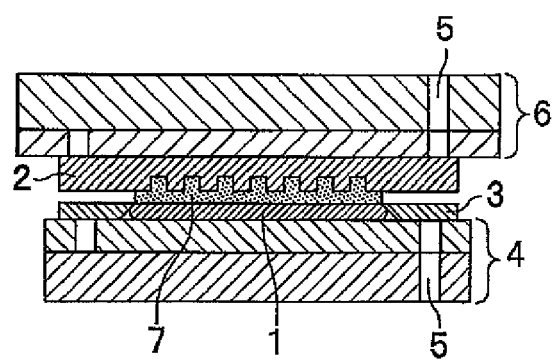

The up-down mechanism not shown lifts up the stage 4. As shown in FIG. 3C, the material to be transferred 1 is pressed against the stamper 2, to thereby spread the photo curable resin 7. Surfaces of the stamper 2 and the material to be transferred 1 may be exposed to reduced pressure or gas atmosphere such as nitrogen, before the stamper 2 and the material to be transferred 1 come in contact with each other. The contact between the stamper 2 and the material to be transferred 1 in such a condition facilitates curing of the photo curable resin 7.

As the photo curable resin 1b, a known resin material with a photosensitive material added thereto is used. The resin material includes, for example, a cycloolefin polymer, a polymethyl methacrylate, a polystyrene, a polycarbonate, a polyethylene terephthalate (PET), a polylactic acid, a polypropylene, a polyethylene, and a polyvinyl alcohol.

The photo curable resin 7 may be applied to the material to be transferred 1 using a dispense method or a spin-coating method. In the dispense method, the photo curable resin 7 is applied by drops onto the material to be transferred 1. The dropped photo curable resin 7 spreads over the surface of the material to be transferred 1, when the stamper 2 comes in contact with the material to be transferred 1. If the photo curable resin 7 is dropped in different positions on the material to be transferred 1, preferably, but not necessarily, each distance between the centers of the drops is larger than each diameter of the drops. A position of dropping the photo curable resin 7 can be determined by estimating a spread of the photo curable resin 7 corresponding to a desired fine indented pattern to be formed. A quantity of the photo curable resin 7 may be equivalent to or more than required for forming a pattern forming layer on which the fine indented pattern is transferred.

Figure 3D:
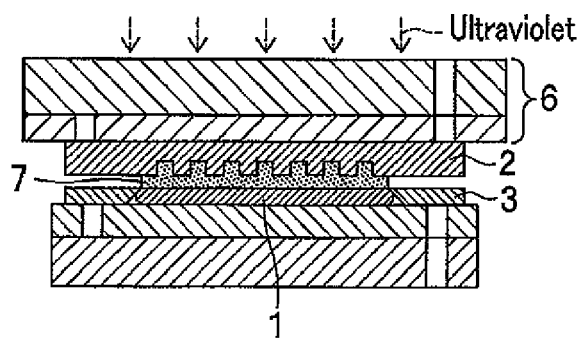

As shown in FIG. 3D, ultraviolet is irradiated from above the plate 6, and the photo curable resin 7 becomes cured.

Figure 3E:
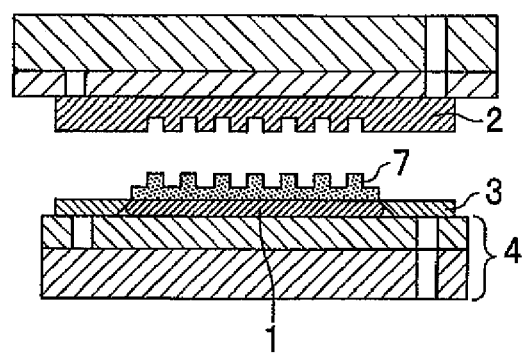

As shown in FIG. 3E, after the photo curable resin 7 becomes cured, the up-down mechanism not shown lifts down the stage 4, to thereby separate the stamper 2 from the material to be transferred 1. As a result, the surface of the material to be transferred 1 has a layer made of the photo curable resin 7 with the fine indented pattern transferred thereon.

Next are described advantages and effects of the micropattern transfer device A1 in this embodiment.

In the micropattern transfer device A1, the holding mechanism 3 holds the entire outer circumferential portion of the material to be transferred 1, and the distance between the material to be transferred 1 and the stamper 2 is substantially the same as the distance between the holding mechanism 3 and the stamper 2, unlike conventional micropattern transfer, devices or methods (see, for example, Japanese Laid-Open Patent Application, Publication No. 2004-335012). Therefore, in the micropattern transfer device A1, load on the stamper 2 and the material to be transferred 1 can be reduced, when the stamper 2 applies pressure onto the material to be transferred 1. Further, in the micropattern transfer device A1, the stamper 2 can be separated from the material to be transferred 1 without damaging the both.

The micropattern transfer device A1 in this embodiment can have similar advantages and effects, even if the holding mechanism 3 holds the material to be transferred 1 such that the material to be transferred 1 is positioned nearer the stamper 2 than the holding mechanism 3 is.

The micropattern transfer device A1 in this embodiment can prevent the stamper 2 and the material to be transferred 1 from being damaged. This allows one and the same stamper 2 to be repeatedly used for transfers.

Second Embodiment

Figure 4A:
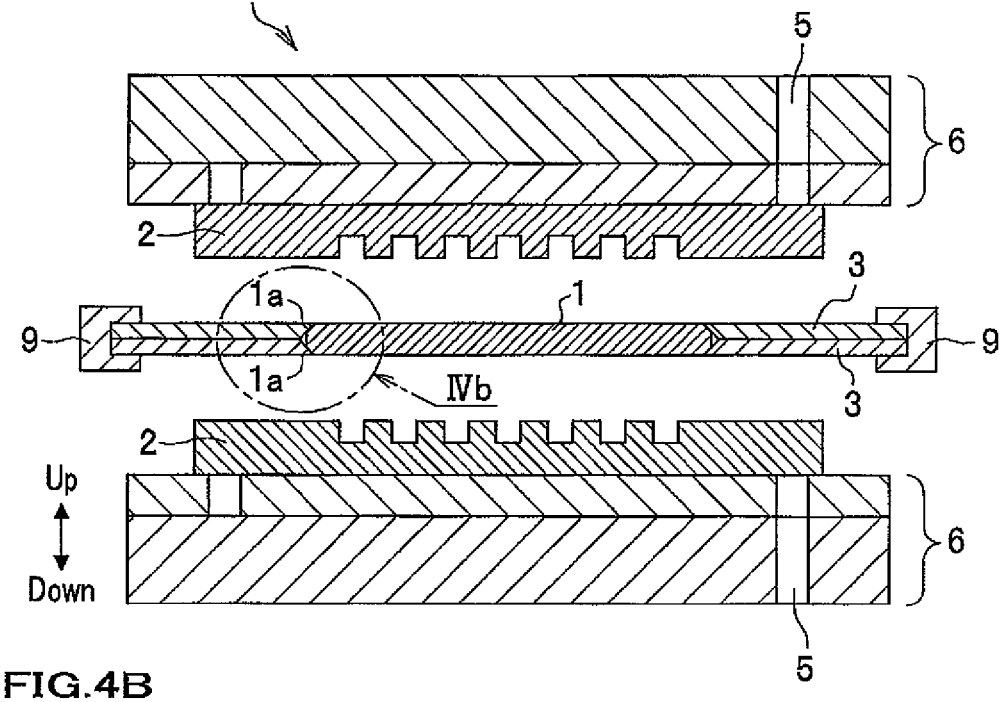
FIG. 4A is a view illustrating a configuration of a micropattern transfer device according to a second embodiment.
Figure 4B:
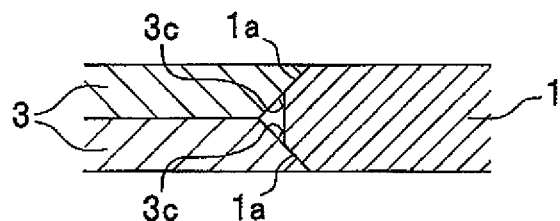
FIG. 4B is a partially enlarged view of a portion "IVd" of FIG. 4A.
Figure 4C:
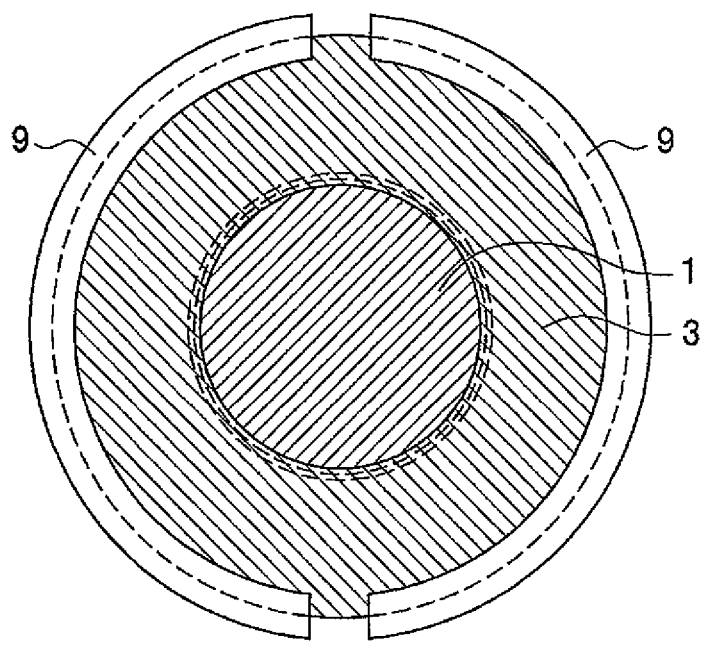
FIG. 4C is a schematic view illustrating a positional relationship between a holding mechanism and a material to be transferred, viewed from the above, of the micropattern transfer device according to the second embodiment.

Next is described a second embodiment of the present invention in detail with reference to related drawings. FIG. 4A is a view illustrating a configuration of a micropattern transfer device according to the second embodiment. FIG. 4B is a partially enlarged view of a portion "IVd" of FIG. 4A. FIG. 4C is a schematic view illustrating a positional relationship between a holding mechanism and a material, to be transferred, viewed from the above, of the micropattern transfer device according to the second embodiment. In the second embodiment, the same names and reference numbers are used for components having the substantially same functions as those in the first embodiment, and detailed description thereof is omitted herefrom.

As shown in FIG. 4A, the micropattern transfer device A2 according to the second embodiment has a configuration in which a pair of the stampers 2, 2 are brought into contact with an upper side surface and a lower side surface of the material to be transferred 1, respectively. Thus, respective fine indented patterns on the stampers 2, 2 are transferred onto the both surfaces of the material to be transferred 1. That is, in the micropattern transfer device A2, a pair of the stampers 2, 2 are disposed to interpose the material to be transferred 1. A pair of the plates 6, 6 having respective vacuum suction ports 5, 5 for holding the stampers 2, 2 are arranged similarly to the configuration of the first embodiment. The plates 6, 6 have respective driving mechanisms (not shown) for pressing the stampers 2, 2 against the material to be transferred 1 and separating the stampers 2, 2 from the material to be transferred 1. The plates 6, 6 may have another respective driving mechanisms (not shown) for moving themselves in parallel to each other so as to align relative positions of the stampers 2, 2.

The inclined parts 1a, 1a are formed at respective outer circumferences of the material to be transferred 1, as shown in FIG. 4A and FIG. 4B. The inclined parts 1a, 1a are inclined such that respective portions on more outward sides thereof are farther from the stampers 2, 2. The inclined parts 1a, 1a are formed by chamfering respective outer circumferential ends of the material to be transferred. This forms the inclined parts 1a, 1a on the respective entire outer circumferences of the material to be transferred 1.

A pair of the holding mechanisms 3, 3 to be described next holds the material to be transferred 1 by hooking the respective inclined parts 1a, 1a formed on the entire outer circumferences.

The micropattern transfer device A2 includes a pair of ring-shaped holding mechanisms 3, 3 as shown in FIG. 4A and FIG. 43.

The holding mechanisms 3, 3 have respective inner circumferential surfaces 3c, 3c having inclined angles same as those of the inclined parts 1a, 1a. The holding mechanisms 3, 3 are placed one above the other such that the inner circumferential surfaces 3c, 3c can come in contact with the respective inclined parts 1a, 1a of the material to be transferred 1, as shown in FIG. 43.

Thus, the inner circumferential surfaces 3c, 3c of the holding mechanisms 3, 3 come in contact with the respective inclined parts 1a, 1a of the material to be transferred 1 at all around the outer circumferences thereof, as shown in FIG. 4A and FIG. 45. This allows the holding mechanisms 3, 3 to hold the entire outer circumference of the material to be transferred 1.

Similarly to the planar part 3b in the first embodiment (see FIG. 3A), the planar parts 3b, 3b of the holding mechanisms 3, 3 shown in FIG. 4A face the stampers 2, 2, respectively.

The holding mechanisms 3, 3 hold the material to be transferred 1, such that, with respect to both the upper side surface and the lower side surface of the material to be transferred 1, a distance between the holding mechanisms 3, 3 and any one of the stampers 2, 2 is substantially equal to a distance between the material to be transferred 1 and the any one of the stampers 2, 2, as shown in FIG. 4A. Similarly to the first embodiment, the holding mechanisms 3, 3 may hold the material to be transferred 1 such that the material to be transferred 1 is positioned nearer the stampers 2, 2 than the holding mechanisms 3, 3 are, though not shown.

The holding mechanisms 3, 3, after holding the material to be transferred 1, are fixed by fixing mechanisms 9, 9, as shown in FIG. 4A and FIG. 40. The fixing mechanisms 9, 9 fix the respective ring-shaped holding mechanisms 3, 3 by each pinching the outer circumferential portions thereof from above and below. The fixing mechanisms 9, 9 in this embodiment are made of elastic body such as rubber and resin. The fixing mechanisms 9, 9 in this embodiment are semicircular arc-shaped as seen from the above. Inner circumferential surfaces of the fixing mechanisms 9, 9 have grooves for receiving the respective outer circumferential portions of the holding mechanisms 3, 3. However, a configuration or a material of the fixing mechanisms 9, 9 is not limited to the aforementioned as long as the fixing mechanisms 9, 9 can keep the holding mechanisms 3, 3 in positions in which the holding mechanisms 3, 3 are suitably placed one above the other.

Next is described a micropattern transfer method using the micropattern transfer device A2 according to this embodiment. FIG. 5A to FIG. 5E to be referenced herein are views for explaining steps of the micropattern transfer method using the micropattern transfer device A2.

Figure 5A:
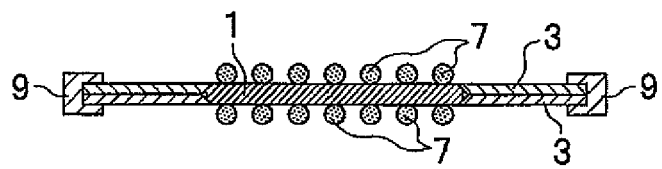
FIG. 5A to FIG. 5E are views for explaining steps of a micropattern transfer method using the micropattern transfer device according to the second embodiment.

In the micropattern transfer method, as shown in FIG. 5A, the photo curable resin 7 is dropped on both the upper side surface and the lower side surface of the material to be transferred 1 held by the pair of holding mechanisms 3, 3. The outer circumferential portions of the holding mechanisms 3, 3 holding the material to be transferred 1 are fixed by the fixing mechanisms 9, 9.

Figure 5B:
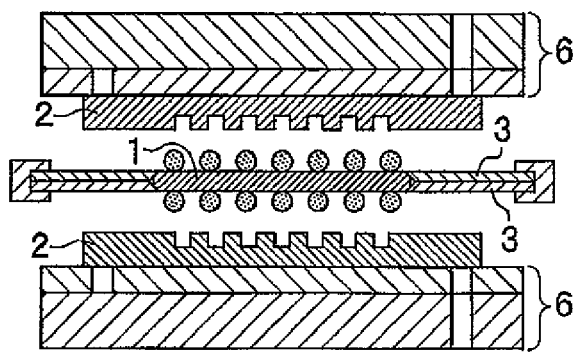

As shown in FIG. 5B, the material to be transferred 1 held by the holding mechanisms 3, 3 is travelled to be interposed between the stampers 2, 2 fixed to the respective plates 6, 6.

Figure 5C:
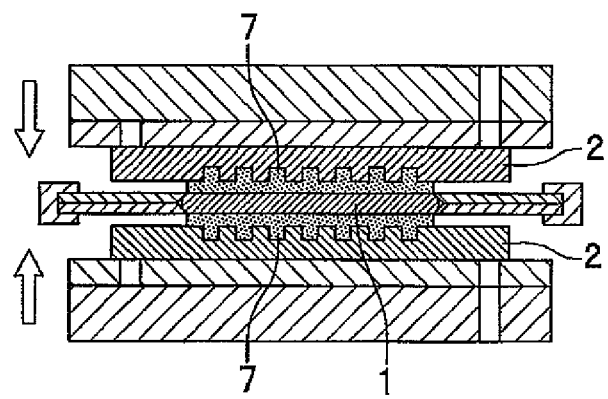

As shown in FIG. 5C, the stampers 2, 2 are pressed against the respective surfaces of the material to be transferred 1, to thereby spread the photo curable resin 7 over the respective surfaces of the material to be transferred 1.

Figure 5D:
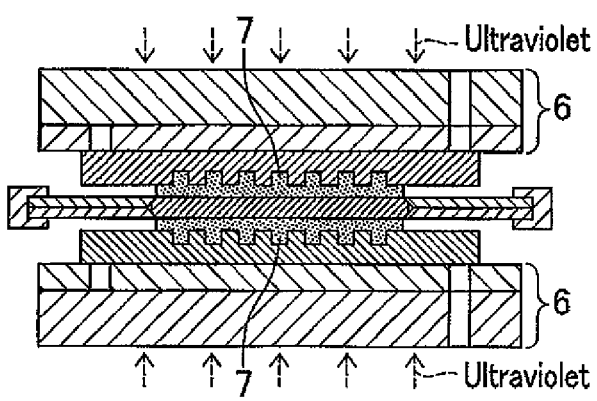

As shown in FIG. 5D, in the micropattern transfer method, ultraviolet is irradiated from above and below the respective plates 6, 6, after which the photo curable resin 7 becomes cured.

Figure 5E:
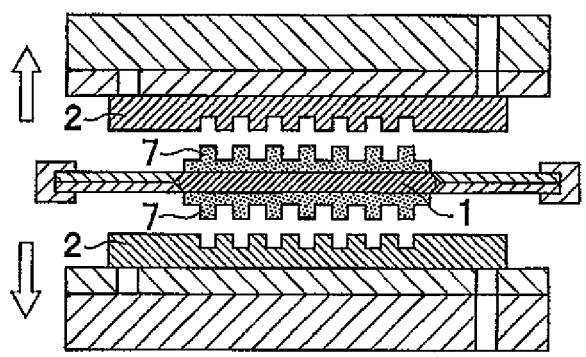

As shown in FIG. 5E, after the photo curable resin 7 becomes cured, the stampers 2, 2 are separated from the material to be transferred 1. As a result, the both surfaces of the material to be transferred 1 have respective layers each made of the photo curable resin 7 with a fine indented pattern transferred thereon.

The micropattern transfer device A2 as described above has advantages and effects similar to those of the micropattern transfer device A1 and enables to transfer a fine indented pattern on the both surfaces of the material to be transferred 1. In the micropattern transfer device A2, the stampers 2, 2 are pressed against the material to be transferred 1 by applying pressure on the both surfaces thereof. This further ensures that the material to be transferred 1 and the stampers 2, 2 are prevented from being damaged.

The first and second embodiments of the present invention have been explained as aforementioned. However, the present invention is not limited to those explanations and can be carried out in various modes. In other embodiments to be described below, the same names and reference numbers are used for components having the substantially same functions as those in the first and second embodiments, and detailed description thereof is omitted herefrom.

Figure 6:
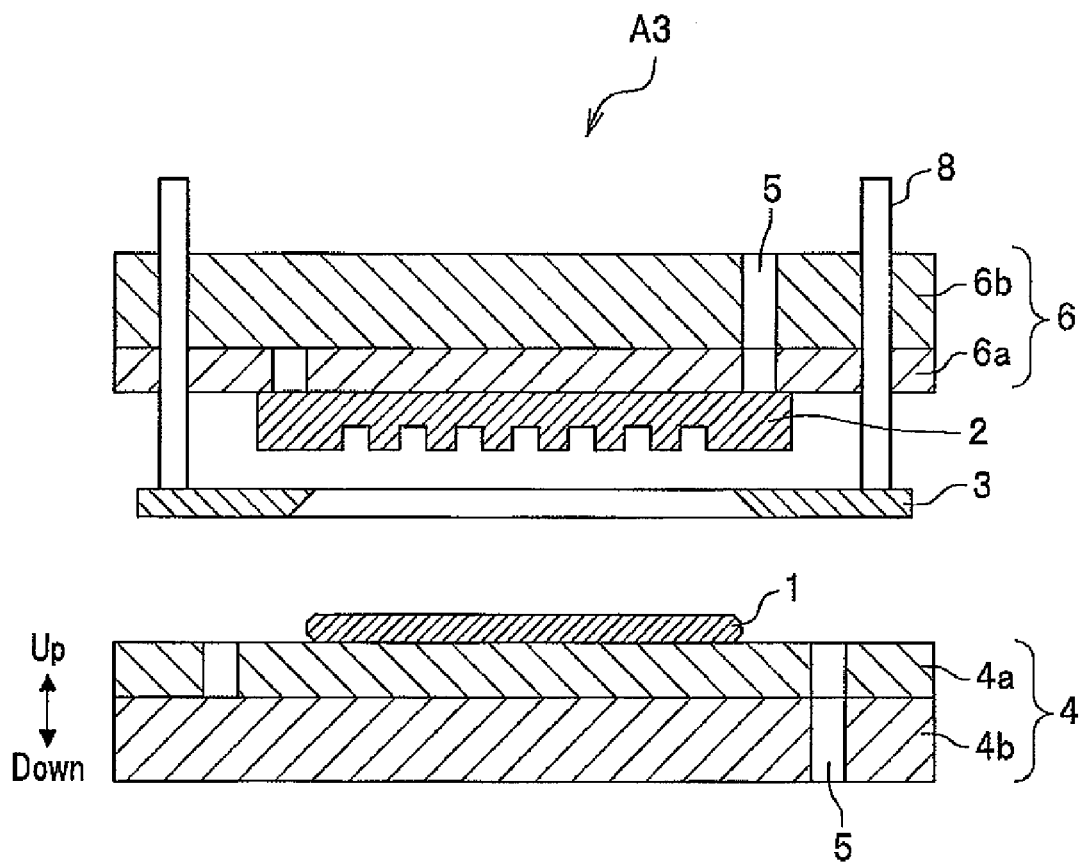
FIG. 6 is a view illustrating a configuration of a micropattern transfer device in which a holding mechanism is fixed by a mechanical means according to another embodiment.

In the first embodiment, the holding mechanism 3 is fixed to the stage 4 by vacuum suction. However, by which means the holding mechanism 3 is fixed to the stage 4 is not limited to this. FIG. 6 to be referenced herein is a view illustrating a configuration of a micropattern transfer device A3 in which the holding mechanism 3 is fixed by a mechanical means.

As shown in FIG. 6, the micropattern transfer device A3 includes an up-down mechanism 8 for moving the holding mechanism 3 up and down.

In the present invention, the holding mechanism 3 can be fixed by any other means such as electrostatic chuck and magnetic force.

Figure 7:
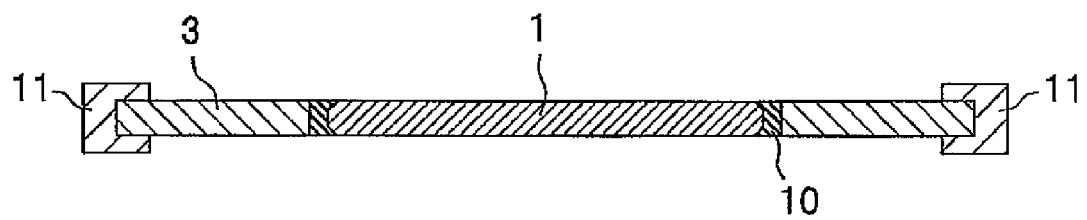
FIG. 7 is a schematic view illustrating a state in which a holding mechanism holds a material to be transferred according to a still another embodiment.

In the first and second embodiments, the holding mechanism 3 directly holds the material to be transferred 1. However, the holding mechanism 3 may hold the material to be transferred 1 via another member. FIG. 7 to be referenced herein is a schematic view illustrating a state in which the holding mechanism 3 holds the material to be transferred 1 via an elastic member 10.

As shown in FIG. 7, the holding mechanism 3 holds the material to be transferred 1 via the elastic member 10 having a Young's modulus lower than that of the holding mechanism 3. The elastic member 10 may be made of a material having the Young's modulus lower than the holding mechanism 3, such as rubber and resin. A reference numeral 11 in FIG. 7 indicates a travelling jig for use in travelling the material to be transferred 1.

The holding mechanism 3 may hold the material to be transferred 1 not only via the elastic member 10 shown in FIG. 7 but also via a member made of a material having a high coefficient of thermal expansion. If such a thermal expansive member is disposed between the material to be transferred 1 and the holding mechanism 3 and is expanded by heating, the material to be transferred 1 can be fixed to the holding mechanism 3. If the thermal expansive member is contracted by cooling, on the contrary, the material to be transferred 1 can be removed from the holding mechanism 3.

In the first embodiment, the photo curable resin 7 is applied to the material to be transferred 1. However, another resin such as thermoplastic resin and thermo-curing resin may be used instead of the photo curable resin 7.

If thermoplastic resin is used, a temperature of the material to be transferred 1 before being pressed by the stamper 2 is required to be not less than a glass transition temperature of the thermoplastic resin. After the stamper 2 is pressed against the material to be transferred 1, the stamper 2 and the material to be transferred 1 are cooled. This enables a fine indented pattern on the stamper 2 to be transferred onto a layer made of the cured thermoplastic resin of the material to be transferred 1.

If thermo-curing resin is used, a temperature of the thermo-curing resin is maintained at a polymerization temperature, after the thermo-curing resin applied to the material to be transferred 1 is pressed against the stamper 2. This enables a fine indented pattern on the stamper 2 to be transferred on a layer made of the cured thermo-curing resin of the material to be transferred 1.

In the first and second embodiments, the plate 6 for holding the stamper 2 includes two transparent plates, the lower transparent plate 6a and the upper transparent plate 6b. In the present invention, however, the plate 6 may be a single transparent plate. In this case, where to arrange the single transparent plate needs to be considered so as to ensure that ultraviolet is irradiated onto a surface of the material to be transferred 1. When the vacuum suction port 5 is cut-machined in the transparent plate 6, preferably, but not necessarily, a cut-machined face of the plate 6 is subjected to polishing so as to make the cut-machined face transparent.

In the first and second embodiments, the micropattern transfer devices A1, A2 are configured assuming that the material to be transferred 1 is made of a non-transparent material. However, the material to be transferred 1 may be made of a material having optical transparency. If such a material to be transferred 1 is used in a micropattern transfer device of the present invention, the stage 4 may also be made of a material having optical transparency. In this case, the photo curable resin 7 becomes cured with irradiation of ultraviolet from below the stage 4.

In the first and second embodiments, the stamper 2 and the plate 6 are each made of a material having optical transparency. However, if thermo-curing resin or thermoplastic resin is applied to the material to be transferred 1, the stamper 2 and the plate 6 may be each made of a material not having optical transparency such as silicone and nickel.

In the second embodiment, the stampers 2, 2 are disposed to sandwich the material to be transferred 1 from above and below. In the present invention, however, the material to be transferred 1 may be disposed upright, and the stampers 2, 2 are disposed to sandwich the material to be transferred 1 from right and left.

The material to be transferred 1 on which a micropattern structure (a fine indented pattern) is transferred using the micropattern transfer devices A1, A2, A3 of the aforementioned embodiments is applicable to an information recording medium such as a magnetic recording medium, an optical recording medium, or the like. The material to be transferred 1 is also applicable to a large-scale integrated circuit component; an optical component such as a lens, a polarizing plate, a wavelength filter, a light emitting device, and an integrated optical circuit; and a biodevice for use in an immune assay, a DNA separation, and a cell culture.

EXAMPLES

Next are described Examples to explain the present invention more specifically.

Example 1

In Example 1, the micropattern transfer device A1 shown in FIG. 1A was used.

The plate 6 included the lower transparent plate 6a and the upper transparent plate 6b which were two quartz plates each having a diameter of 200 mm and a thickness of 50 mm.

The stamper 2 used was a quartz substrate having a diameter of 150 mm and a thickness of 0.5 mm. A fine indented pattern made up of successive grooves formed of a plurality of concentric circles with a pitch of 100 nm was created on the pattern forming area 2a of the stamper 2 having a diameter of 110 mm, using a known direct electron beam writing method. Each of the grooves had a width of 50 nm and a depth of 80 nm.

The material to be transferred 1 used was a glass substrate having a diameter of 100 mm and a thickness of 0.7 mm. The inclined part 1a having a width of 0.15 mm and an inclined angle of 45 degrees was formed on an outer circumferential portion of the material to be transferred 1.

The holding mechanism 3 used was a ring-shaped member made of stainless steel which was machined to have an outer diameter of 150 mm, an inner diameter of 99.9 mm, and a thickness of 0.69 mm. The inner circumferential surface 3c also had an inclined angle of 45 degrees so as to come in contact with the inclined part 1a. The inclined part 1a of the material to be transferred 1 was brought into contact with and fixed to the inner circumferential surface 3c of the holding mechanism 3. The holding mechanism 3 was vacuum suctioned and fixed to the stage 4 made of stainless.

The photo curable resin 7 applied to a surface of the material to be transferred 1 was an acrylate resin with a photosensitive substance added thereto and was prepared to have a viscosity of 4 mPa·s. The photo curable resin 7 was dropped onto the surface of the material to be transferred 1 by a head in which 512 nozzles (256 nozzles×2 rows) were arranged using the piezo method. A distance between the nozzles was 70 μm in a row direction and a distance between adjacent rows was 140 μm.

An amount of a drop of the photo curable resin 7 discharged from each of the nozzles was controlled to be about 5 μm. A pitch of the drops was set at 140 μm in a radial direction and 280 μm in a circumferential direction.

After the photo curable resin 7 was dropped onto the material to be transferred 1, the material to be transferred 1 was pressed by the stamper 2 with a pressure of 0.2 MPa for 5 seconds. Ultraviolet with an irradiance of 200 mJ/cm$^2$ was irradiated from above the plate 6. The stamper 2 was then separated from the material to be transferred 1, on which the cured photo curable resin 7 was formed.

Figure 8:
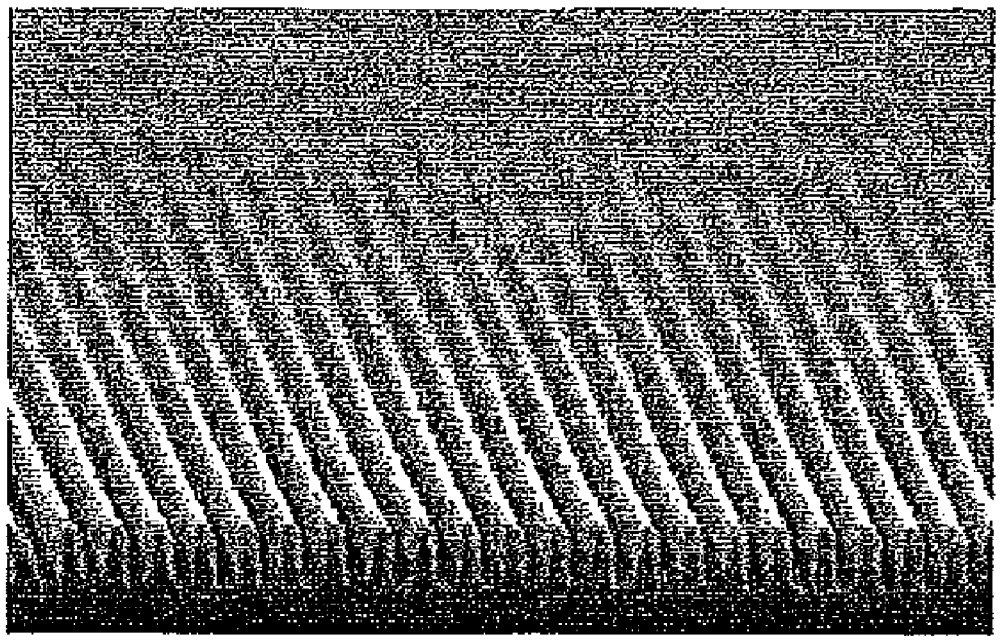
FIG. 8 is a SEM image of an indented pattern transferred onto a surface of a material to be transferred according to Example 1.

The surface of the material to be transferred 1 taken out from the micropattern transfer device A1 was observed using SEM. A pattern of grooves complementary to a fine indented pattern on the stamper 2 was recognized on the surface of the material to be transferred 1. Each of the grooves had a width of 50 nm, a depth of 80 nm, and a pitch of 100 nm. FIG. 8 is a SEM image of the pattern transferred onto the material to be transferred 1 in Example 1.

The above-described transfer under the same condition was conducted 100 consecutive times using the micropattern transfer device A1, after which the material to be transferred 1 and the stamper 2 were not damaged.

Example 2

In Example 2, a fine indented pattern on the stamper 2 was transferred onto the material to be transferred 1, similarly to Example 1, except that the micropattern transfer device A3 shown in FIG. 6 was used.

The transfer under the same condition as that in Example 1 was conducted 100 consecutive times, after which the material to be transferred 1 and the stamper 2 were not damaged.

Example 3

In Example 3, fine indented patterns formed on the respective stampers 2, 2 were transferred on the upper and lower side surfaces of the material to be transferred 1, using the micropattern transfer device A2 shown in FIG. 4A.

The material to be transferred 1 used was a glass substrate having a diameter of 65 mm and a thickness of 0.6 mm. The inclined parts 1a, 1a each having a width of 0.15 mm and an inclined angle of 45 degrees were formed at respective outer circumferential portions on the upper and lower side surfaces of the material to be transferred 1.

The holding mechanisms 3, 3 used were made of stainless steel and had each an outer diameter of 100 mm and a thickness of 0.29 mm. The holding mechanisms 3, 3 had each a center hole within a range of an inner diameter of 64.7 mm from its center. The inner circumferential surfaces 3c, 3c were formed to have each an inclined angle of 45 degrees.

The fixing mechanism 9 used was made of rubber.

Using the above-described micropattern transfer device A2, fine indented patterns similar to that in Example 1 were transferred onto the both surfaces of the material to be transferred 1. Patterns of grooves complementary to the fine indented patterns on the stampers 2, 2 were transferred onto respective resin layers each having a thickness of 10 nm formed on the both surfaces of the material to be transferred 1. Each of the grooves had a width of 50 nm, a depth of 80 nm, and a pitch of 100 nm.

The above-described transfer under the same condition as that in Example 1 was conducted 100 consecutive times, after which the material to be transferred 1 and the stamper 2 were not damaged.

Example 4

In Example 4, the material to be transferred 1 held by the holding mechanism 3 via the elastic member 10 shown in FIG. 7 was used.

The material to be transferred 1 used was the same as that used in Example 3.

The holding mechanism 3 used was ring-shaped, made of stainless, and machined to have an outer diameter of 100 mm, an inner diameter of 66 mm, and a thickness of 0.59 mm.

The elastic member 10 used was ring-shaped, made of rubber, and machined to have an outer diameter of 100 mm, an inner diameter of 66 mm, and a thickness of 0.59 mm. A groove for fitting therein the outer circumferential portion of the material to be transferred 1 was formed on en inner circumferential portion of the elastic member 10.

In Example 4, fine indented patterns on the respective stampers 2, 2, similar to the fine indented pattern in Example 1, were transferred onto the upper and lower side surfaces of the material to be transferred 1, using the micropattern transfer device A2, similarly to Example 3, except that the material to be transferred 1 was held by the holding mechanism 3 via the elastic member 10 shown in FIG. 7. Thus, patterns of grooves complementary to the fine indented patterns on the stampers 2, 2 were transferred onto respective resin layers each having a thickness of 10 nm on the both surfaces of the material to be transferred 1. Each of the grooves had a width of 50 nm, a depth of 80 nm, and a pitch of 100 nm.

The above-described transfer under the same condition as that in Example 3 was conducted 100 consecutive times, after which the material to be transferred 1 and the stamper 2 were not damaged.

Example 5

In Example 5, a material onto which a micropattern for a large capacity recording medium (a discrete track medium) was transferred was manufactured using the micropattern transfer device A1 in Example 1.

The material to be transferred 1 used was a glass substrate for a magnetic recording medium having a diameter of 65 mm, a thickness of 0.63 mm, and a center hole diameter of 20 mm.

Similarly to Example 1, a pattern of grooves complementary to a micropattern on the stamper 2 was formed on a surface of the material to be transferred 1. Each of the grooves has a width of 50 nm, a depth of 80 nm, and a pitch of 100 nm.

The above-described transfer under the same condition as described above was conducted 100 consecutive times, after which the material to be transferred 1 and the stamper 2 were not damaged.

Example 6

In Example 6, a method of manufacturing a discrete track medium using the micropattern transfer device A1 in Example 1 is descried with reference to related drawings. FIG. 9A to FIG. 9D are views for explaining steps of the method of manufacturing a discrete track medium in Example 6.

Figure 9A:
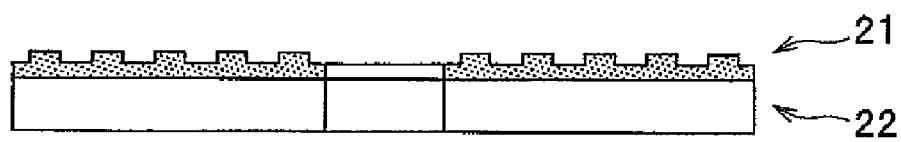
FIG. 9A to FIG. 9D are views for explaining steps of a method of manufacturing a discrete track medium according to Example 6.

As shown in FIG. 9A, a glass substrate 22 having thereon a pattern formation layer 21 was prepared. The pattern formation layer 21 was made of photo curable resin with a micropattern on the stamper 2 transferred therein.

Figure 9B:
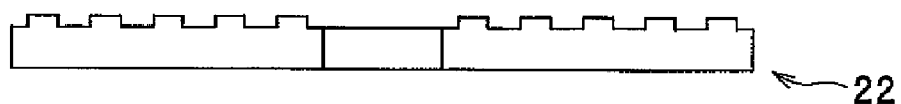

A surface of the glass substrate 22 was dry-etched with a known dry etching method, utilizing the pattern formation layer 21 as a mask. As a result, as shown in FIG. 9B, an indented microstructure complementary to the micropattern on the pattern formation layer 21 was etched on the surface of the glass substrate 22. The dry etching was performed with fluorine-based gas. Alternatively, the dry etching may be performed in such away that a thin layer portion of the pattern formation layer 21 is removed using the oxygen plasma etching, and an exposed portion of the glass substrate 22 is etched with fluorine-based gas.

Figure 9C:
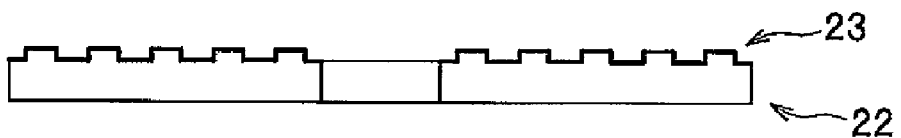

As shown in FIG. 9C, a magnetic recording medium forming layer 23 was formed on the glass substrate 22 with the indented microstructure formed thereon, using a known DC magnetron sputtering method (see, for example, Japanese Laid-Open Patent Application, Publication No. 2005-038596). The magnetic recording medium forming layer 23 included a precoat layer, a magnetic domain control layer, a soft magnetic foundation layer, an intermediate layer, a vertical recording layer, and a protective layer. The magnetic domain control layer in this Example included a nonmagnetic layer and an antiferromagnetic layer.

Figure 9D:
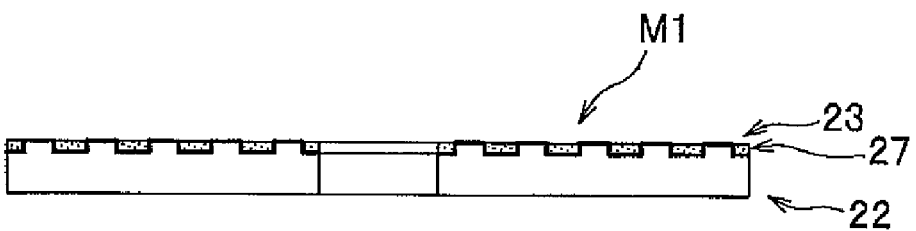

As shown in FIG. 9D, a nonmagnetic material 27 was applied to the magnetic recording medium forming layer 23, to thereby make the surface of the glass substrate 22 flat. After the steps described above, a discrete track medium M1 having a surface recording density of about 200 GbPsi was obtained.

Example 7

In Example 7, a method of manufacturing a discrete track medium using the micropattern transfer method of the present invention is described with reference to related drawings. FIG. 12A to FIG. 12E to be referenced herein are views for explaining steps of the method of manufacturing a discrete track medium in Example 7.

Figure 10A:
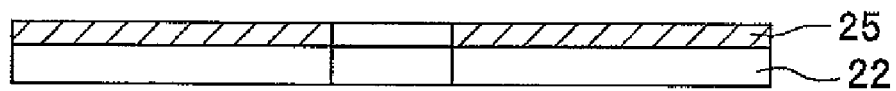
FIG. 10A to FIG. 10E are views for explaining steps of a method of manufacturing a discrete track medium according to Example 7.

In Example 7, as shown in FIG. 10A, the glass substrate 22 having the soft magnetic foundation layer 25 thereon was prepared, instead of the glass substrate 22 having the pattern formation layer 21 thereon, which was obtained in Example 4.

Figure 10B:
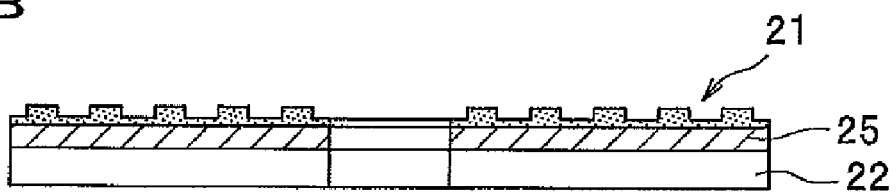

As shown in FIG. 10B, the pattern formation layer 21 made of photo curable resin on which a micropattern on the stamper 2 was transferred, similarly to Example 1, was formed on the soft magnetic foundation layer 25.

Figure 10C:
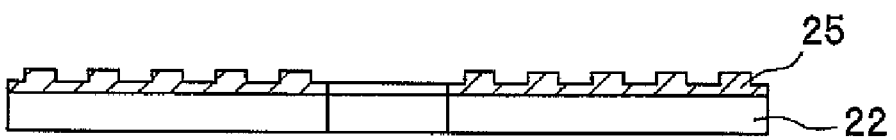

A surface of the soft magnetic foundation layer 25 was dry-etched with a known dry etching method, utilizing the pattern formation layer 21 as a mask. Thus, as shown in FIG. 10C, the dry etching created an indented microstructure complementary to the micropattern of the pattern formation layer 21, on the surface of the soft magnetic foundation layer 25. The dry etching herein was performed with fluorine-based gas.

Figure 10D:

As shown in FIG. 10D, the magnetic recording medium forming layer 23 was formed on the soft magnetic foundation layer 25, on which the indented micropattern was created, using a known DC magnetron sputtering method (see, for example, Japanese Laid-Open Patent Application, Publication No. 2005-038596). The magnetic recording medium forming layer 23 included a precoat layer, a magnetic domain control layer, a soft magnetic foundation layer, an intermediate layer, a vertical recording layer, and a protective layer. The magnetic domain control layer in this example included a nonmagnetic layer and an antiferromagnetic layer.

Figure 10E:
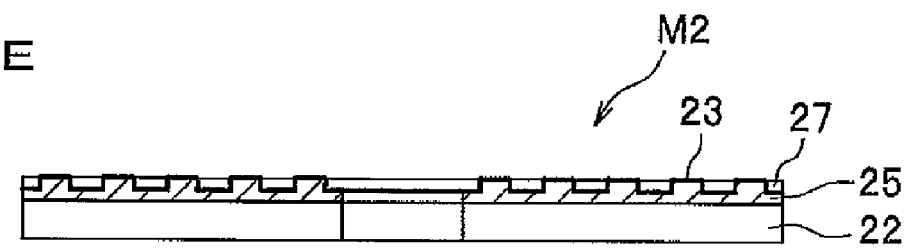

As shown in FIG. 10E, a nonmagnetic material 27 was applied to the magnetic recording medium forming layer 23, to thereby make a top surface of the soft magnetic foundation layer 25 flat. With the steps described above, a discrete track medium M2 having a surface recording density of about 200 GbPsi was obtained.

Example 8

In Example 8, a method of manufacturing a disk for a discrete track medium using the micropattern transfer method of the present invention is described with reference to related drawings. FIG. 11A to FIG. 11E to be referenced herein are views for explaining steps of the method of manufacturing a disk for a discrete track medium in Example 8.

Figure 11A:
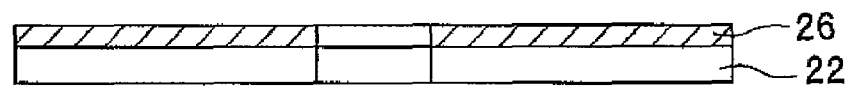
FIG. 11A to FIG. 11E are views for explaining steps of a method of manufacturing a disk for a discrete track medium according to Example 8.

As shown in FIG. 11A, a novolac resin material was previously applied to a surface of the glass substrate 22 to form a flat layer 26. The flat layer 26 may be formed by the spin coat method or by pressing a resin material with a flat plate.

Figure 11B:
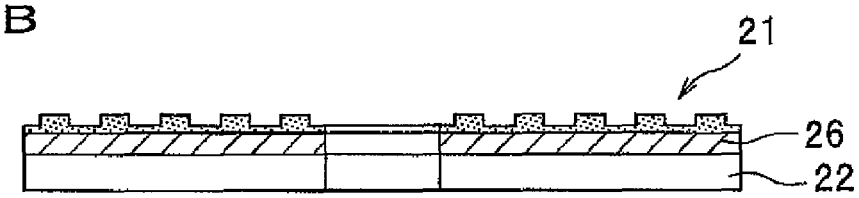

As shown in FIG. 11B, the pattern formation layer 21 was formed on the flat layer 26 by applying a resin material containing silicone to the flat layer 26 and using the micropattern transfer method of the present invention.

Figure 11C:
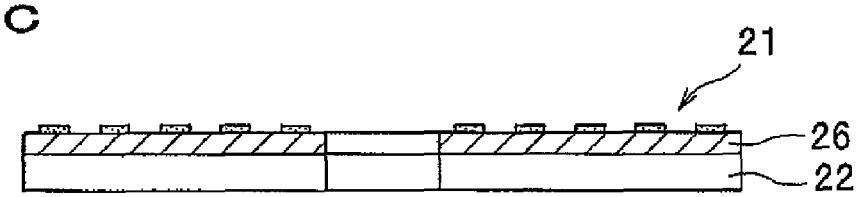

As shown in FIG. 11C, a thin layer portion of the pattern formation layer 21 was removed with a dry etching method using fluorine-based gas.

Figure 11D:
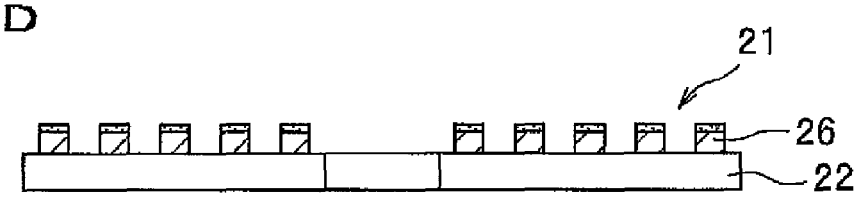

As shown in FIG. 11D, the flat layer 26 was removed with the oxygen plasma etching, utilizing a not-yet-removed portion of the pattern formation layer 21 as a mask.

Figure 11E:
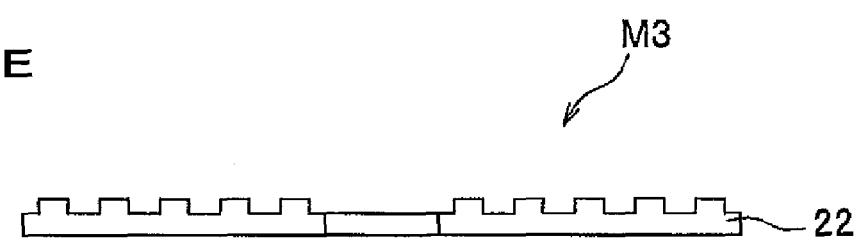

As shown in FIG. 11E, the surface of the glass substrate 22 was etched with the dry etching method using fluorine-based gas, to thereby remove the not-yet-removed portion of the pattern formation layer 21. With the steps described above, a disk substrate M3 used as a discrete track medium having a surface recording density of about 200 GbPsi was obtained.

Example 9

In Example 9, another method of manufacturing a disk for a discrete track medium using the micropattern transfer method of the present invention is described with reference to related drawings. FIG. 32A to FIG. 12E to be referenced herein are views for explaining steps of a method of manufacturing a disk for a discrete track medium in Example 9.

Figure 12A:
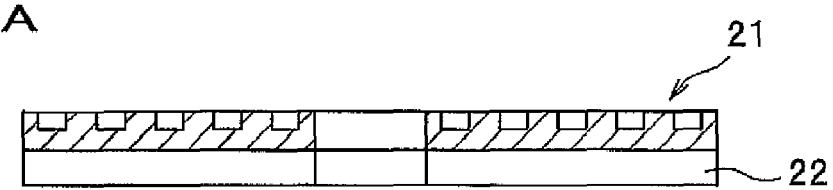
FIG. 12A to FIG. 12E are views for explaining steps of a method of manufacturing a disk for a discrete track medium according to Example 9.

As shown in FIG. 12A, the pattern formation layer 21 was formed on the glass substrate 22 by applying an acrylate resin material with a photosensitive substance added thereto, to a surface of the glass substrate 22 and by using the micropattern transfer method of the present invention. In this example, a pattern having an indented structure complementary to a desired one was formed on the glass substrate 22.

Figure 12B:
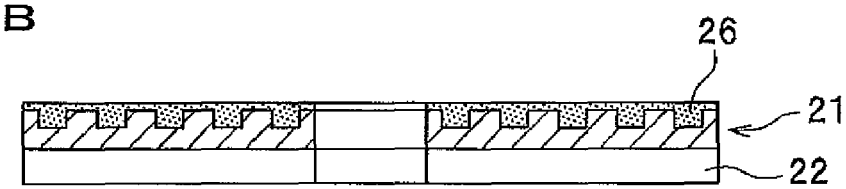

As shown in FIG. 12B, a resin material containing silicone and a photosensitive substance was applied to a surface of the pattern formation layer 21 to form the flat layer 26. The flat layer 26 may be formed by the spin coat method or by pressing the resin with a flat plate.

Figure 12C:
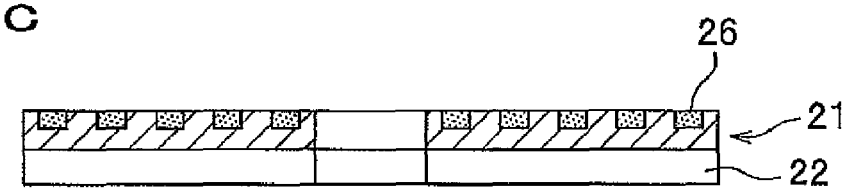

As shown in FIG. 12C, a surface of the flat layer 26 was etched using fluorine-based gas to expose a top surface of the pattern formation layer 21.

Figure 12D:
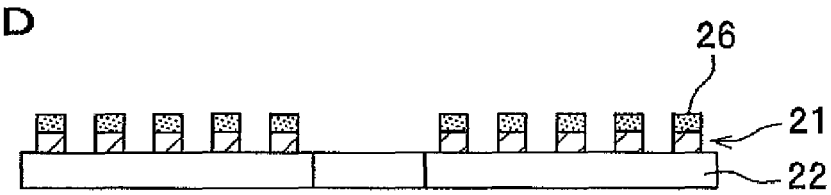
Figure 12E:
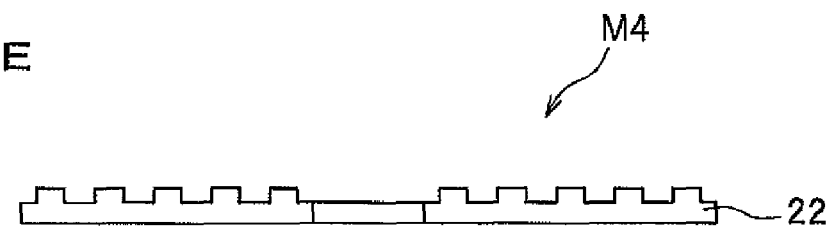

As shown in FIG. 12D, the pattern formation layer 21 was removed with the oxygen plasma etching method utilizing a not-yet-removed portion of the flat layer 26 as a mask. This exposes a portion of the surface of the glass substrate 22.

As shown in FIG. 12E, a surface of the exposed portion of as the glass substrate 22 was etched using fluorine-based gas.

With the Steps described above, a disk substrate M4 for use in a discrete track medium having a surface recording density of about 200 GbPsi was obtained.

Comparative Example 1

In Comparative Example 1, consecutive transfers were conducted using a comparative device similar to the micropattern transfer device A1 in Example 1 and a method similar to that in Example 1, except that the comparative device lacked the holding mechanism 3. A surface of the stamper 2 of the comparative device was damaged at 20th transfers.

Comparative Example 2

In Comparative Example 2, consecutive transfers were conducted using another comparative device similar to the micropattern transfer device A1 in Example 1 and a method similar to that in Example 1. The comparative device had a holding mechanism which held not the entire outer circumferential portion but about one third of the outer circumferential portion of the material to be transferred 1. An end portion of the material to be transferred 1 was damaged when the material to be transferred 1 was separated from the stamper 2 at the first transfer.

The invention claimed is:

1. A micropattern transfer device comprising:
a stamper on which a fine indented pattern is formed;
a material to be transferred onto which the fine indented pattern on the stamper is transferred; and
a holding mechanism which holds an entire outer circumferential portion of the material to be transferred;
wherein the stamper on which the fine indented pattern is formed is brought into contact with the material to be transferred, and the fine indented pattern on the stamper is transferred onto a surface of the material to be transferred;
wherein the holding mechanism holds the material to be transferred such that a distance between the material to be transferred and the stamper is substantially equal to or shorter than a distance between the holding mechanism and the stamper; and
wherein a difference between a distance between the stamper and the holding mechanism and a distance between the stamper and the material to be transferred is within about 0.1 mm.

2. A micropattern transfer device comprising:
a first stamper and a second stamper on which respective fine indented patterns are formed;
a material to be transferred, onto a first side surface and a second side surface of which the respective fine indented patterns on the first and second stampers are transferred, respectively; and
a first holding mechanism and a second holding mechanism each of which holds an entire outer circumferential portion of the material to be transferred;
wherein the first and second stampers on which the respective fine indented patterns are formed are brought into contact with the material to be transferred, and the respective fine indented patterns on the first and second stampers are transferred onto the first and second side surfaces of the material to be transferred;
wherein the first and second holding mechanisms hold the material to be transferred such that respective distances between the material to be transferred and the first and second stampers are substantially equal to or shorter than respective distances between the first and second holding mechanisms and the first and second stampers; and
wherein a difference between a distance between the first stamper and the first holding mechanism and a distance between the first stamper and the material to be transferred is within about 0.1 mm, and a difference between a distance between the second stamper and the second holding mechanism and a distance between the second stamper and the material to be transferred is also within about 0.1 mm.

* * * * *